United States Patent [19]
Lur et al.

[11] Patent Number: 5,512,768
[45] Date of Patent: Apr. 30, 1996

[54] CAPACITOR FOR USE IN DRAM CELL USING SURFACE OXIDIZED SILICON NODULES

[75] Inventors: Water Lur, Taipei; Johnson Liu, Tour U Shiang; Jiunn-Yuan Wu, Guu Keng Shiang, all of Taiwan

[73] Assignee: United Microelectronics Corporation, Hsin-Chy, Taiwan

[21] Appl. No.: 214,591

[22] Filed: Mar. 18, 1994

[51] Int. Cl.$^6$ .......................... H01L 27/04; H01L 27/108
[52] U.S. Cl. ............................... 257/309; 257/534
[58] Field of Search ................................ 257/308, 307, 257/309, 311, 306, 534, 532

[56] References Cited

U.S. PATENT DOCUMENTS

| | | | |
|---|---|---|---|
| 4,859,622 | 8/1989 | Eguchi | 437/47 |
| 5,068,199 | 11/1991 | Sandhu | 437/52 |
| 5,110,752 | 5/1992 | Lu | 437/47 |
| 5,134,086 | 7/1992 | Ahn et al. | 437/52 |
| 5,158,905 | 10/1992 | Ahn | 437/52 |
| 5,164,881 | 11/1992 | Ahn | 361/313 |
| 5,182,232 | 1/1993 | Chhabra et al. | 437/200 |
| 5,204,280 | 4/1993 | Dhong et al. | 437/52 |
| 5,213,992 | 5/1993 | Lu | 437/52 |
| 5,227,322 | 7/1993 | Ko et al. | 437/47 |
| 5,244,842 | 9/1993 | Cathey et al. | 437/228 |
| 5,254,503 | 10/1993 | Kenney | 437/228 |
| 5,256,587 | 10/1993 | Jun et al. | 437/52 |
| 5,302,540 | 4/1994 | Ko et al. | 437/52 |
| 5,304,828 | 4/1994 | Kim et al. | 437/233 |
| 5,308,786 | 5/1994 | Lur et al. | 437/67 |
| 5,313,100 | 5/1994 | Ishii et al. | 257/751 |
| 5,332,696 | 6/1994 | Kim et al. | 257/309 |
| 5,342,800 | 8/1994 | Jun et al. | 437/52 |
| 5,350,707 | 9/1994 | Ko et al. | 437/47 |

FOREIGN PATENT DOCUMENTS

| | | | |
|---|---|---|---|
| 3266460 | 3/1990 | Japan | 257/620 |
| 2308551 | 12/1990 | Japan | 257/620 |
| 4-26156 | 1/1992 | Japan | 257/309 |
| 4-99373 | 3/1992 | Japan | 257/307 |
| 2259406 | 3/1992 | United Kingdom | 257/309 |

OTHER PUBLICATIONS

Wolf et al., *Silicon Processing For the VLSI Era*, vol. 1, Lattice Press 1986, pp. 400–401, 581.

Jun et al., *The Fabrication and Electrical Properties of Modulated Stacked Capacitor for Advanced DRAM Applications*, IEEE (1992).

IBM Technical Disclosure, *Method of Increasing Capacitance Area Using RIE Selectivity*, vol. 35, No. 7 (Dec. 1992).

*Primary Examiner*—Donald L. Monin, Jr.
*Attorney, Agent, or Firm*—Meltzer, Lippe, Goldstein, et al.

[57] ABSTRACT

A MOST capacitor structure in accordance with the invention is formed by using surface oxidized silicon nodules after metal etching to define polysilicon pillars with annular cross sections and with diameters of 0.05 to 0.2 microns.

1 Claim, 5 Drawing Sheets

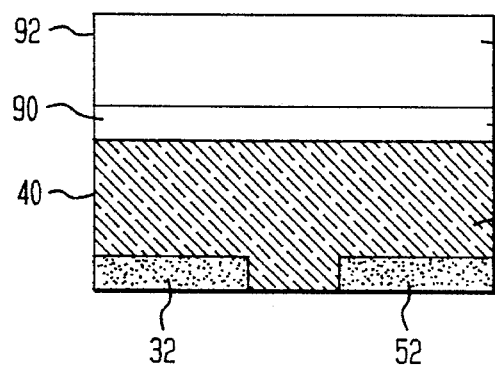
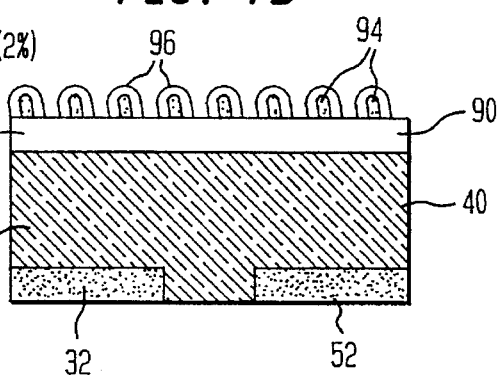
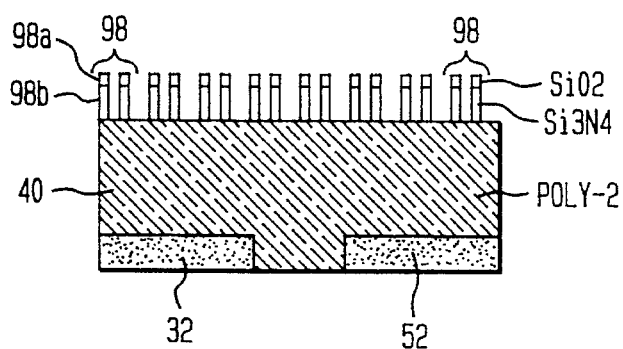
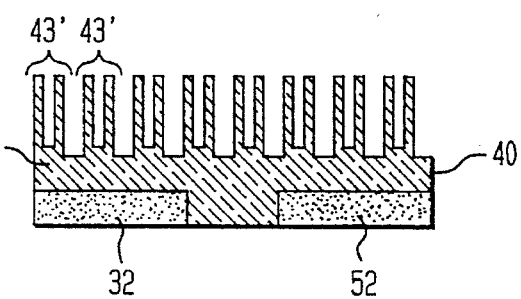
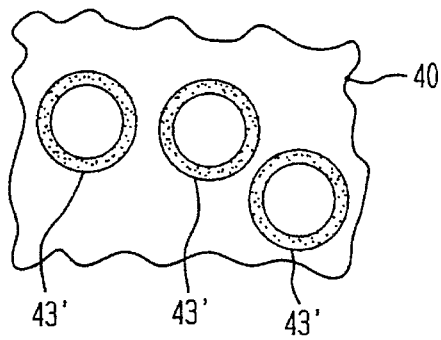

CAPACITOR FOR USE IN DRAM CELL USING SURFACE OXIDIZED SILICON NODULES

FIELD OF THE INVENTION

The present invention relates to a technique for forming a modulated stacked capacitor for use in a Dynamic Random Access Memory (DRAM) cell.

BACKGROUND OF THE INVENTION

A DRAM cell typically comprises a MOS transistor and a capacitor. An example of such a DRAM cell is shown in FIG. 1. The DRAM cell 10 of FIG. 1 comprises the MOSFET 12 and the capacitor 14. A word line is connected to the gate of the MOSFET 14. A bit line is connected to the source of the MOSFET 12. The capacitor 14 is connected to the drain of the MOSFET 12. The state of the DRAM cell 10 is determined by whether or not the capacitor 14 is holding a charge.

The DRAM cell is read by using the bit line to determine whether or not a charge is stored in the capacitor. The DRAM cell is written by using the bit line to add or remove charge from the capacitor. However, the cell can only be read or written when the cell is addressed (i.e. activated) by the word line.

With the continuous advancement of DRAM technology, the chip area used for one DRAM cell is getting smaller. There are two methods used to increase the capacitance of the capacitor in the DRAM cell. One method is to decrease the effective dielectric thickness and the other method is to increase the effective capacitor surface area.

It is expected that future scaled DRAM cells will rely heavily on the quality and storage capacity of ultra thin dielectric materials that are sandwiched between two heavily doped polysilicon and/or silicon electrodes. However, higher capacitance values cannot be obtained without seriously degrading the device retention time. Specifically, films thinner than 50 angstroms present excessive leakage current due to direct carrier tunneling. For a given capacitor dielectric film, the larger the surface area, the larger the capacitance.

FIGS. 2, 3, 4, 5 and 6 illustrate prior art DRAM cells. The DRAM cell 20 of FIG. 2 comprises a MOSFET 22 and a capacitor 24 which are both formed on a silicon substrate 25. The MOSFET 22 comprises the source and drain regions 26 and 28, which regions are separated by the channel 29. It should be noted that the source and drain regions 26, 28 have a conductivity type opposite to that of the substrate. A metal contact 27 directly contacts the source region 26. A gate 30 is formed from polysilicon material (Poly-1) and is separated from the surface of the substrate by an oxide layer 31. An additional oxide region 32 is on top of the gate 30.

The capacitor 24 sits on top of the drain region 28. The capacitor 24 has a first electrode 40 formed by a conducting polysilicon material (poly-2), a thin dielectric layer 42 which may be NO or ONO, and a second electrode 44 which is formed from a conducting polysilicon material (poly-3). The capacitor contacts the drain region 28 in a space between the oxide region 32 and the oxide region 52.

FIG. 3 shows a DRAM cell 20' which is similar to the DRAM cell 20 of FIG. 2. The main difference is that the shape of the poly-2 electrode layer 40, dielectric layer 42 and poly-3 electrode layer 44 have been altered to increase the surface area of the capacitor 24.

FIG. 4 shows a DRAM cell 20" in which the poly-2 electrode 40 has been made rugged to increase the surface area of the capacitor.

FIG. 5 shows a DRAM cell 20''' in which the polysilicon electrode 40 is formed from a plurality of horizontal layers 41 to increase the surface area of the capacitor.

Another capacitor structure which can be used to increase the capacitance of a DRAM cell is known as MOST (modulated stacked) capacitor. (See e.g. Y. K. Jun et al, "The Fabrication and Electrical Properties of Modulated Stacked Capacitor for Advance DRAM Applications" IEEE Electron Device Letters, Vol. 13, No. 8, August 1992, the contexts of which are incorporated herein by reference).

A DRAM cell 20'''' having a MOST capacitor structure is illustrated in FIG. 6. In the capacitor 24 of FIG. 6, the poly-2 electrode 40 comprises a plurality of spaced apart vertical pillars 43. The capacitor dielectric 42 and poly-3 electrode 44 are then deposited over the spaced apart vertical pillars 43. In this manner a capacitor with a large effective surface area is formed in a DRAM cell.

It is an object of the present invention to provide a technique for manufacture of a MOST capacitor for use in a DRAM cell.

SUMMARY OF THE INVENTION

A MOST capacitor structure in accordance with the invention is formed by using surface oxidized silicon nodules after metal etching to define polysilicon pillars with annular cross sections and with diameters of 0.05 to 0.2 microns.

BRIEF DESCRIPTION OF THE DRAWING

FIGS. 7(a), 7(b), 7(c), and 7(d) illustrate a technique for forming a MOST capacitor for use in a DRAM cell in accordance with the present invention.

FIG. 8 shows the top-view of the polysilicon pillars formed in a polysilicon electrode layer in accordance with the invention.

DETAILED DESCRIPTION OF THE INVENTION

Figure 1:
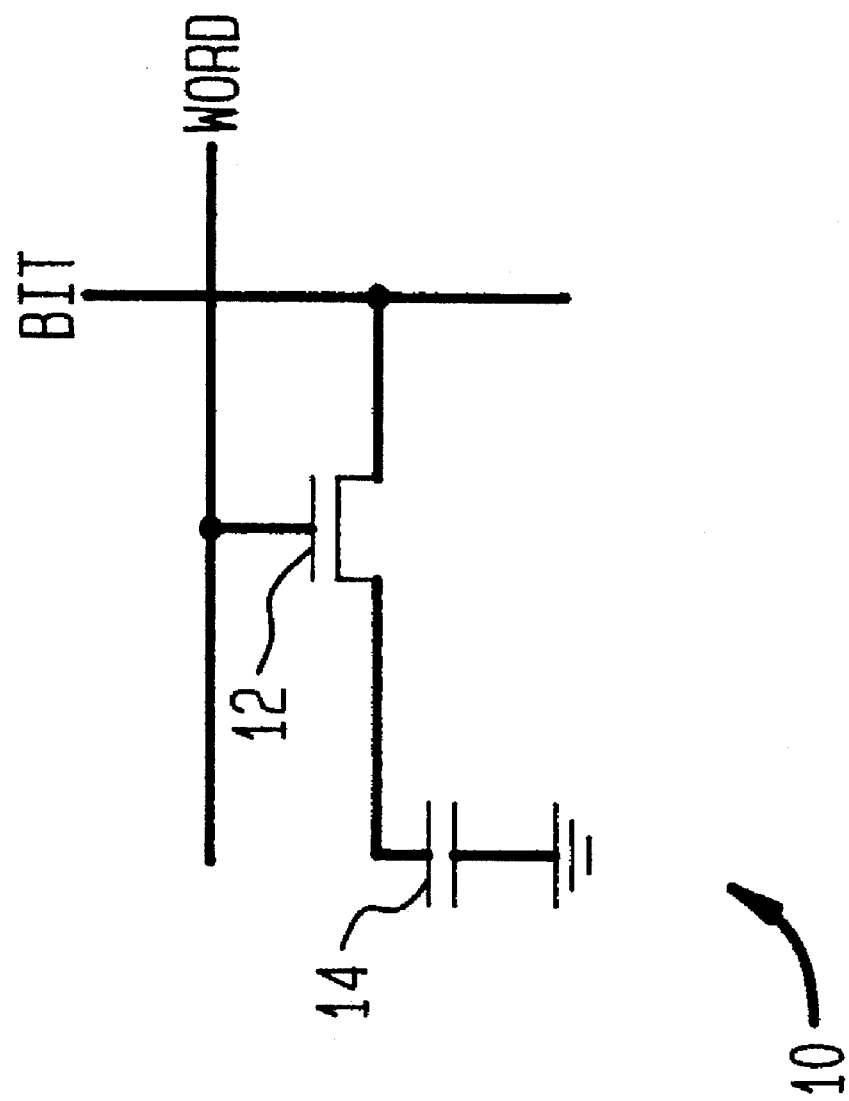
FIG. 1 schematically illustrates DRAM cell.
Figure 2:
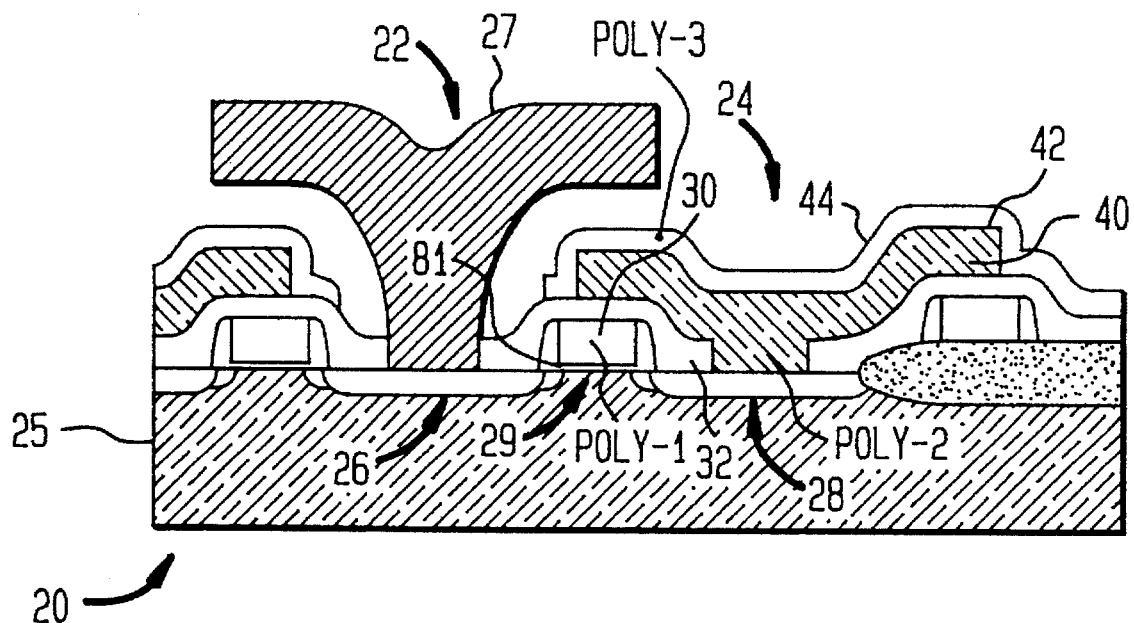
FIGS. 2–6 illustrate various prior art capacitors utilized in DRAM cells.
Figure 3:
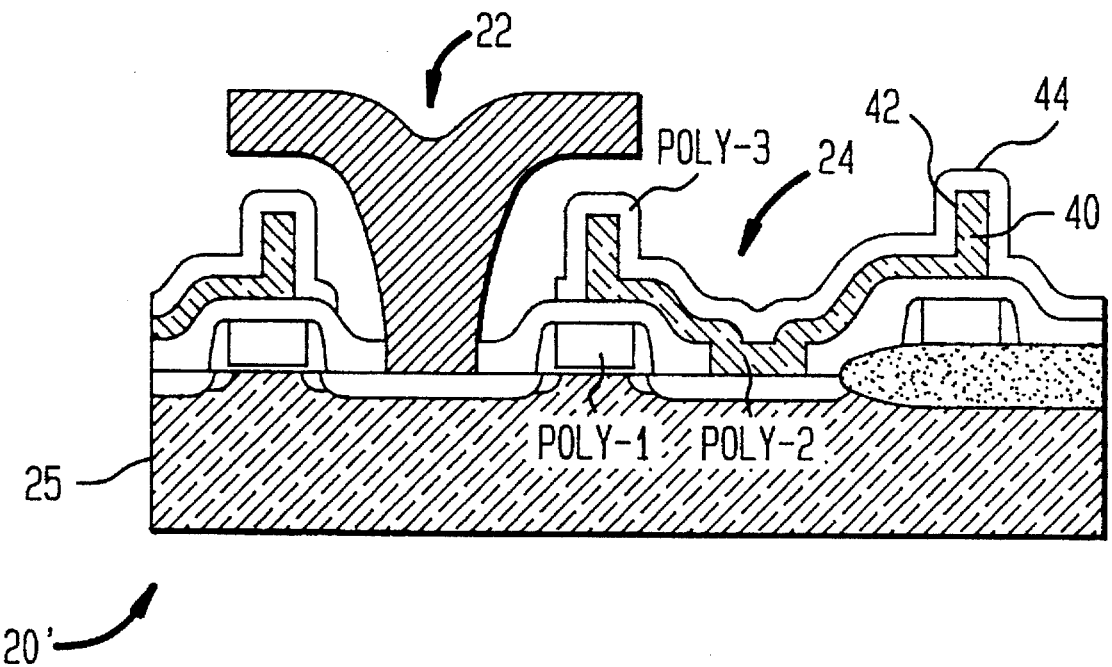
Figure 4:
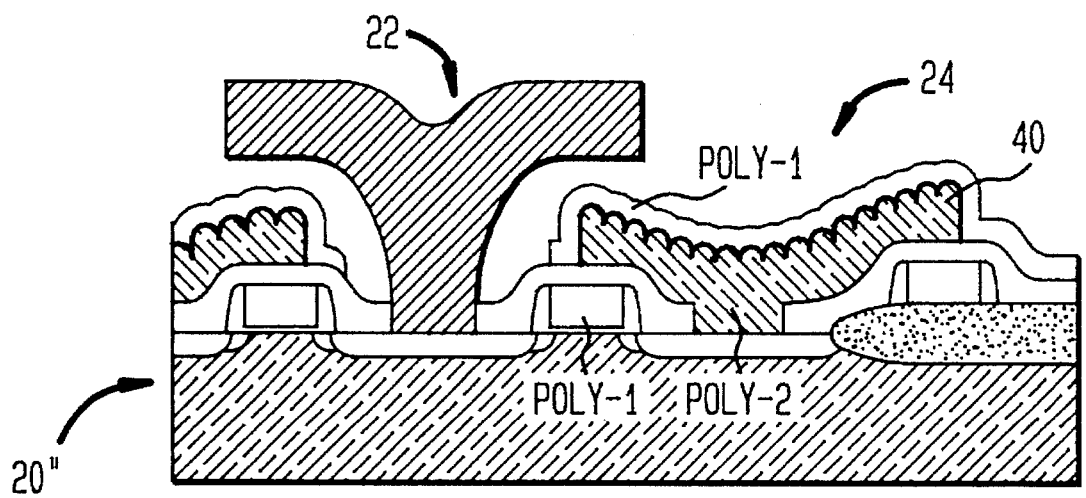
Figure 5:
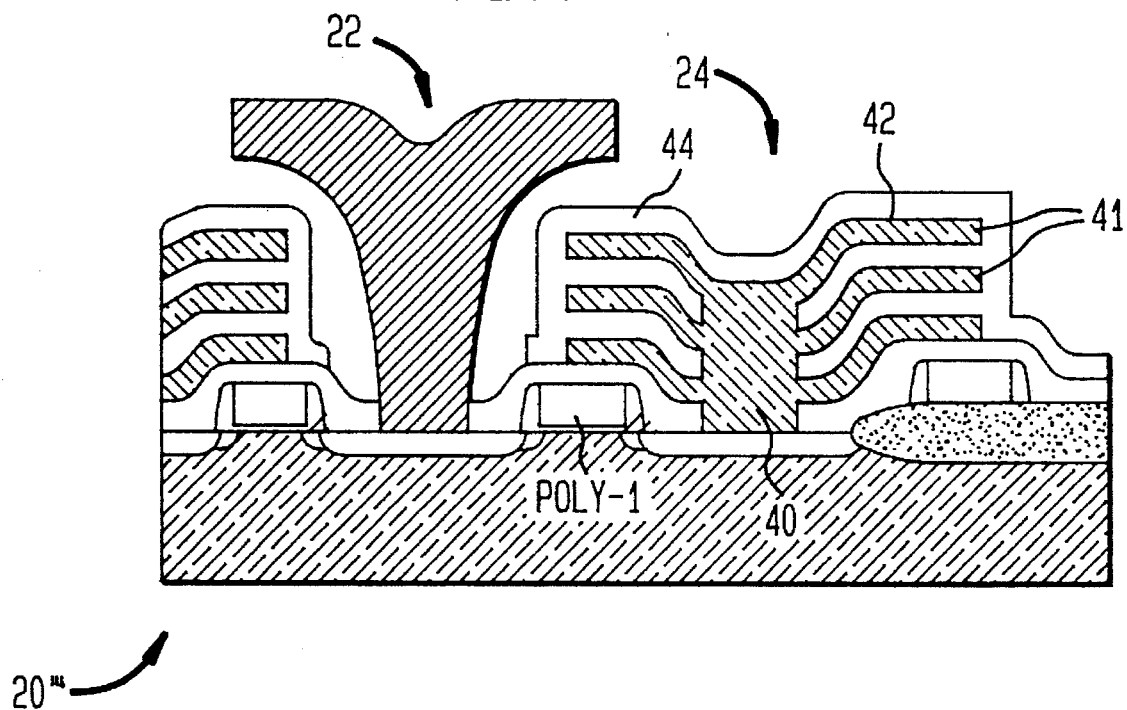
Figure 6:
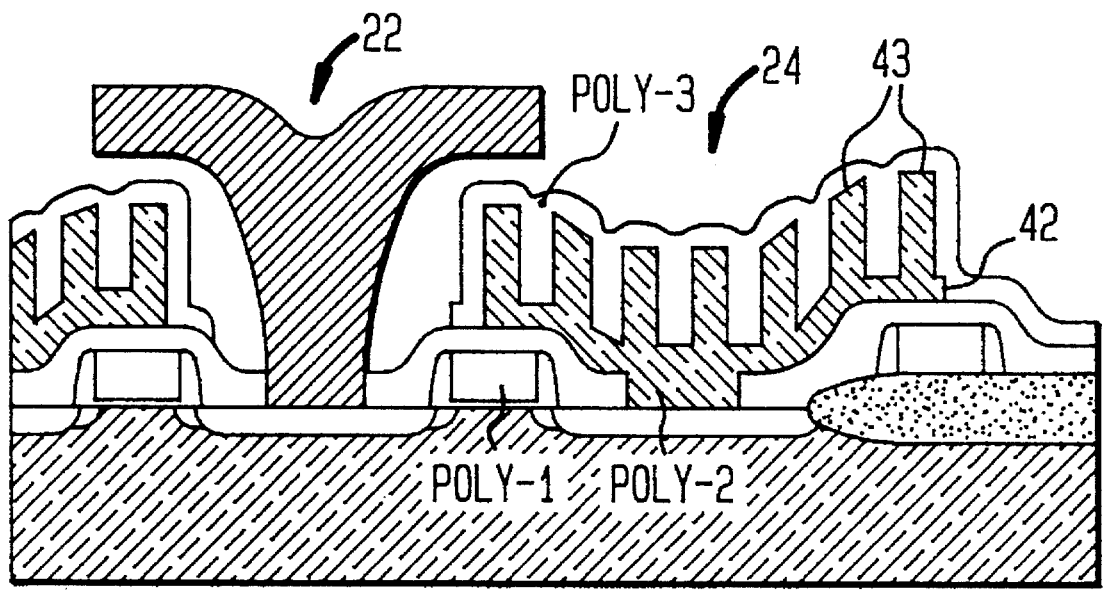

A capacitor used in a DRAM is formed in accordance with an illustrative embodiment of the invention as follows:

1. As shown in FIG. 7(a), a polysilicon (poly-2) electrode layer 40 is deposited on top of the oxide regions 32 and 52 and on top of the substrate 25 (not shown in FIG. 7(a), but see FIGS. 2–6). The poly-2 layer has a thickness between 5 to 10 thousand angstroms and is deposited by chemical vapor deposition or a similar technique after the formation of poly contacts.
2. The polysilicon electrode layer 40 is doped with POCl$_3$ or is implanted with phosphorous or arsenic or the like to become conductive.
3. A nitride layer (Si$_3$N$_4$) 90 with a thickness of 500–2000 Angstroms is deposited on the polysilicon electrode layer 40.
4. A metal layer 92, typically aluminum alloy, e.g. Al-Si (1–4%.) with a thickness of 0.8 to 2.0 microns is deposited on the nitride layer 90 at a temperature of about 400° C. or post treated at 400° C. to form silicon precipitates in the layer 92.

5. The metal layer 92 is then reactive ion etched to the endpoint (i.e. to the nitride layer 90) to leave silicon nodules 94 on the nitride layer as shown in FIG. 7(*b*). The nodules have a size of 0.05 to 0.2 microns. The silicon nodules 94 are then oxidized at a temperature in the range of about 800° C.–900° C. for 10 seconds to 30 minutes to form an oxide layer 96 on the surface of each nodule 94. The oxide layer 96 on each nodule 94 has a thickness of 100 to 300 Angstroms. An alternative technique for obtaining a thin oxide on the side walls or side surfaces of the silicon nodules 92 is to deposit a thin oxide layer over the nodules 94 and over the nitride layer 90 and then etch back to form oxide spacers on the side walls of silicon nodules.

6. Using the oxides on the side walls of the nodules as a mask, the silicon nodules 94 as well as the portions of the nitride layer 90 not under the oxide side walls are removed by reactive ion etching. (Note, it may also be necessary to remove any oxide on the top surfaces of the silicon nodules). The result is a plurality of annular cylindrical shaped islands formed on the polysilicon electrode layer 40. A cross-sectional view of the annular cylindrical shaped islands can be seen in FIG. 7(*c*). The cross-section of each annular cylindrical shaped island is labeled 98 in FIG. 7(*c*). As shown in FIG. 7(*c*), each annular cylindrical shaped island 98 has an upper annular section 98*a* made of $SiO_2$ and a lower annular section 98*b* made of $Si_3N_4$. The diameter size of each annular cylindrical shaped island 98 is 0.05 to 0.2 microns as seen in FIG. 7(*c*).

7. Using the annular cylindrical shaped islands 98 as a mask, the polysilicon electrode layer 40 is etched to a depth of 4000–8000 Angstroms to form a plurality of annular cylindrical polysilicon pillars 43'. Then the islands 98 are dipped away using HF content solution. The annular cylindrical pillars 43' are shown in cross-section in FIG. 7(*d*). A top view of the annular cylindrical pillars 43' on the polysilicon electrode layer 40 is shown in FIG. 8. The wall thickness of the annular cylindrical polysilicon pillars 43' is 100–300 Angstroms and the diameter of the annular cylindrical polysilicon pillars is 0.05 to 0.2 microns.

8. The capacitor dielectric layer 42 (see FIG. 6) is then deposited on top of the now modulated (i.e. modulated with the pillars 43') surface of the polysilicon electrode layer 40. The dielectric layer 42 may be NO or ONO.

9. The polysilicon electrode layer 40 and dielectric layer 42 are etched to isolate the capacitor structure.

10. A second polysilicon electrode layer 44 (see FIG. 6) is deposited on top of the dielectric layer, doped to become conductive and etched to complete the capacitor.

11. The metalization (e.g. contact 27 of FIG. 2) is deposited to complete the DRAM cell structure.

It should be noted that the structure size of the pillars 43' (wall thickness 100–300 Angstroms, diameter 0.05 to 0.2 microns) is generally much smaller than any other feature size on the wafer containing the capacitor. As a result of this small pillar size, the surface area of the capacitor is very large and the capacitance is very large.

Finally, the above described embodiment of the invention are intended to be illustrative only. Numerous alternative embodiments may be devised by those skilled in the art without departing form the spirit and scope of the following claims.

We claim:

1. A capacitor for use in a DRAM cell comprising, (a) a first polysilicon electrode layer, said first polysilicon electrode layer having a surface with a plurality of annular cylindrical polysilicon pillars, (b) a dielectric layer on said surface of said first polysilicon electrode layer, and (c) a second polysilicon electrode layer on said dielectric layer, wherein said annular cylindrical pillars have a wall thickness of 100–300 Angstroms and a diameter of 0.05 to 0.2 microns.

\* \* \* \* \*